(12) United States Patent
Nagasaka et al.

(10) Patent No.: US 7,541,801 B2
(45) Date of Patent: Jun. 2, 2009

(54) PROBE CARD TRANSFER ASSIST APPARATUS, AND INSPECTION EQUIPMENT AND METHOD USING SAME

(75) Inventors: Munetoshi Nagasaka, Nirasaki (JP); Chiaki Mochizuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 143 days.

(21) Appl. No.: 11/523,710

(22) Filed: Sep. 20, 2006

(65) Prior Publication Data

US 2007/0063720 A1 Mar. 22, 2007

(30) Foreign Application Priority Data

Sep. 21, 2005 (JP) ............................. 2005-273195

(51) Int. Cl.
*G01R 31/02* (2006.01)
(52) U.S. Cl. .................................................. 324/158.1
(58) Field of Classification Search ....................... None
See application file for complete search history.

(56) References Cited

U.S. PATENT DOCUMENTS 5,444,386 A * 8/1995 Mizumura .................. 324/754
5,640,100 A * 6/1997 Yamagata et al. ........... 324/754
6,414,478 B1 * 7/2002 Suzuki ..................... 324/158.1
6,838,892 B2 * 1/2005 Suzuki ....................... 324/754

FOREIGN PATENT DOCUMENTS

JP 63217636 A * 9/1988

* cited by examiner

*Primary Examiner*—Vinh P Nguyen
(74) *Attorney, Agent, or Firm*—Oblon, Spivak, McClelland, Maier & Neustadt, P.C.

(57) ABSTRACT

A probe card transfer assist apparatus for assisting an operation of transferring a probe card used in an electrical inspection apparatus includes a holder for holding the probe card; a support for supporting the holder in a freely-rotate manner about a point; and an elevation unit for moving the support up and down. Further, an inspection equipment includes an electrical inspection apparatus; and a probe card transfer assist apparatus for assisting an operation of transferring a probe card used in the electrical inspection apparatus, the assist apparatus including a holder for holding the probe card; a support for supporting the holder in a freely-rotating manner about a point; and an elevation unit for moving the support up and down.

23 Claims, 8 Drawing Sheets

PROBE CARD TRANSFER ASSIST APPARATUS, AND INSPECTION EQUIPMENT AND METHOD USING SAME

FIELD OF THE INVENTION

The present invention relates to an inspection equipment and method, the equipment including a plurality of inspection apparatuses each for performing an electrical characteristics inspection for an object-to-be-inspected such as a wafer or the like by employing a probe card; and, more particularly, to a probe card transfer assist apparatus, which facilitates operations of transferring a probe card between an inspection apparatus and a transfer vehicle in the inspection equipment, and an inspection equipment and method employing same.

BACKGROUND OF THE INVENTION

This type of inspection apparatus includes for example, as shown in FIG. 7, a loader chamber 1 for transferring an object-to-be-inspected (e.g., a wafer) W and a prober chamber 2, disposed adjacent to the loader chamber 1, for performing an electrical characteristics inspection of the wafer W loaded therein from the loader chamber 1. The prober chamber 2, as shown in FIG. 7, includes a mounting table (wafer chuck) 3 for mounting thereon a wafer and disposed in a manner capable of moving in the directions of X, Y, Z and θ; a probe card 4 having a card holder and disposed at a location above the wafer chuck 3; and a clamp mechanism 5 for holding the probe card 4. Within the prober chamber 2, while the wafer chuck 3 is being moved in the directions of X, Y, Z and θ, an alignment of the wafer W and probe pins 4A of the probe card 4 is performed with an alignment device 6. Therefore, the electrical characteristics inspection is performed on the wafer W while index transporting the wafer W. In addition, the alignment device 6 includes an upper camera 6A and a lower camera 6B. The reference character T represents a test head.

For mounting and removing the probe card 4 to and from the clamp mechanism 5 placed within the prober chamber 2, there is provided, for example, a probe card carrying mechanism disclosed in Japanese Patent Laid-open Application No. 2001-24039 which was filed by the present assignee. The card carrying mechanism, as shown in FIG. 8, includes the wafer chuck 3 and a transfer unit 7 which transfers the probe card 4 to and from the wafer chuck 3. The transfer unit 7, as shown in FIG. 8, includes an adapter 8 having the card holder, the adapter 8 holding the probe card 4 in a freely attachable and removable manner; a bifurcated fork shaped arm 9 for holding the adapter 8 in a freely attachable and removable manner; a pair of guide rails 10 which guide the probe card 4 to a transfer location by sliding the arm 9 inwards in the direction of an arrow A; and an arm support 11 on which the guide rails 10 are fixed. Further, the adapter 8 holding the probe card 4 thereon is transferred between the arm 9 and an adapter support 12 disposed at the wafer chuck 3.

Moreover, when transferring the probe card 4 to the clamp mechanism 5 by employing the card carrying mechanism, an operator for example positions the probe card 4 onto the transfer unit 7, and then transfers the probe card 4 to a position directly below the clamp mechanism 5 using the card carrying mechanism. Thereafter, the operator elevates the wafer chuck 3 from the above-mentioned position, and then securely places the probe card 4 to a main body of the inspection apparatus with the clamp mechanism 5. Further, as illustrated in FIG. 8, the reference numeral 13 represents a receiving part which receives the transfer unit 7 folded in an opposite direction of an arrow B.

However, in case of positioning the probe card 4 onto the card carrying mechanism, the operator is required to physically move the probe card 4 to the inspection apparatus from a maintenance shelf; or required to move the probe card 4 to the inspection apparatus from the maintenance shelf by using a transfer vehicle or the like, and then transfer the probe card 4 from the transfer vehicle to the card carrying mechanism in order to install the probe card 4 to the inspecting apparatus 52, for example.

Yet, as a consequence of a recent scaling-up of the probe card 4 causing its weight to increase, for example, to 15-25 kg, a lot of strength is needed to move the probe card 4 from the transfer vehicle to the card carrying mechanism. Furthermore, in case of lifting the probe card 4 only with hands, the grip portions are limited, thereby giving the operator an enormous amount of burden in the process.

SUMMARY OF THE INVENTION

It is, therefore, an object of the present invention to provide a probe card transfer assist apparatus capable of reducing the burden of operator and allowing easy transferring of the probe card even in case of handling a heavy probe card, and provide an inspection equipment and method employing same.

In accordance with one aspect of the present invention, there is provided a probe card transfer assist apparatus which assists an operation of transferring a probe card used in an electrical inspection apparatus, the apparatus including:

a holder for holding the probe card;

a support for supporting the holder in a freely-rotate manner about a point; and an elevation unit for moving the support up and down.

Further, the holder may include a coupling member capable of connecting with the probe card by rotational manipulation.

Further, the holder may be attached at an arm protruded from the support, the arm capable of extending and contracting.

Further, the elevation unit may include:

a cylinder mechanism for moving the arm up and down;

a valve for opening and closing a line through which a driving fluid is supplied to the cylinder mechanism;

a regulator for controlling pressure of the driving fluid;

an input terminal for inputting a weight of the probe card to the regulator in advance, the regulator being controlled based on the weight of the probe card; and a pressure sensor for detecting the pressure of the driving fluid.

Further, the elevation unit may be configured to provide an assisting force in a direction of which the card is pushed upwards.

Further, the assisting force may be varied according to a weight of the probe card.

Further, the holder may include a sensor for checking a rotational end position of the coupling member.

Further, the assist apparatus may be disposed at the inspection apparatus.

Further, the assist apparatus may be provided between the inspection apparatus and a transfer means for transferring the probe card, when assisting the transferring of the probe card between the inspection apparatus and the transfer means.

Further, the transfer means may be a transfer vehicle.

In accordance with another aspect of the present invention, there is provided an inspection equipment including:

an electrical inspection apparatus; and a probe card transfer assist apparatus for assisting an operation of transferring a probe card used in the electrical inspection apparatus, the assist apparatus including:

a holder for holding the probe card;

a support for supporting the holder in a freely-rotating manner about a point; and an elevation unit for moving the support up and down.

Further, the holder may include a coupling member capable of connecting with the probe card by rotational manipulation.

Further, the holder may be attached at an arm protruded from the holder, the arm capable of extending and contracting.

Further, the elevation unit may include:

a cylinder mechanism for moving the arm up and down;

a valve for opening and closing a line through which a driving fluid is supplied to the cylinder mechanism;

a regulator for controlling pressure of the driving fluid;

an input terminal for inputting a weight of the probe card to the regulator in advance, the regulator being controlled based on the weight of the probe card; and a pressure sensor for detecting the pressure of the driving fluid.

Further, the elevation unit may be capable of providing an assisting force in the direction of which the probe card is pushed upwards.

Further, the assisting force may be varied according to a weight of the probe card.

Further, the holder may include a sensor for checking a rotational end position of the coupling member.

Further, the equipment may be disposed at the inspection apparatus.

Further, the equipment may be provided between the inspection apparatus and a transfer means for transferring the probe card, when assisting the transferring of the probe card between the inspection apparatus and the transfer means.

Further, the transfer means may be a transfer vehicle.

In accordance with still another aspect of the present invention, there is provided an inspection method including the steps of:

(a) transferring a probe card to an area adjacent to the inspection apparatus;

(b) transferring the probe card to the inspection apparatus; and (c) performing an electric inspection by contacting the probe card to an object-to-be-inspected, wherein the step (b) includes:

a process of supporting the probe card;

a process of moving the probe card up and down; and a process of rotating the probe card about a point.

Further, the method may include a plurality of the inspection apparatuses; and in the step (a), the probe card is transferred by a transfer vehicle capable of moving along a passageway provided along the inspection apparatuses.

Further, the method may further include the step of detecting presence of the probe card prior to the step of moving the probe card up and down in the step (b).

Further, the step of moving the probe card up and down may include controlling of a force required to move the probe card up and down based on a weight of the probe card by using a driving fluid supplied to a cylinder mechanism.

Therefore, in accordance with claims 1 to 24 of the present invention, there is provided the probe card transfer assist apparatus, thereby reducing the burden of operator even in case of handling probe cards heavy in weight and allowing easy transfers of the probe cards; and an inspection equipment and method.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, there will be described preferred embodiments of the present invention with reference to the accompanying drawings.

Figure 1:
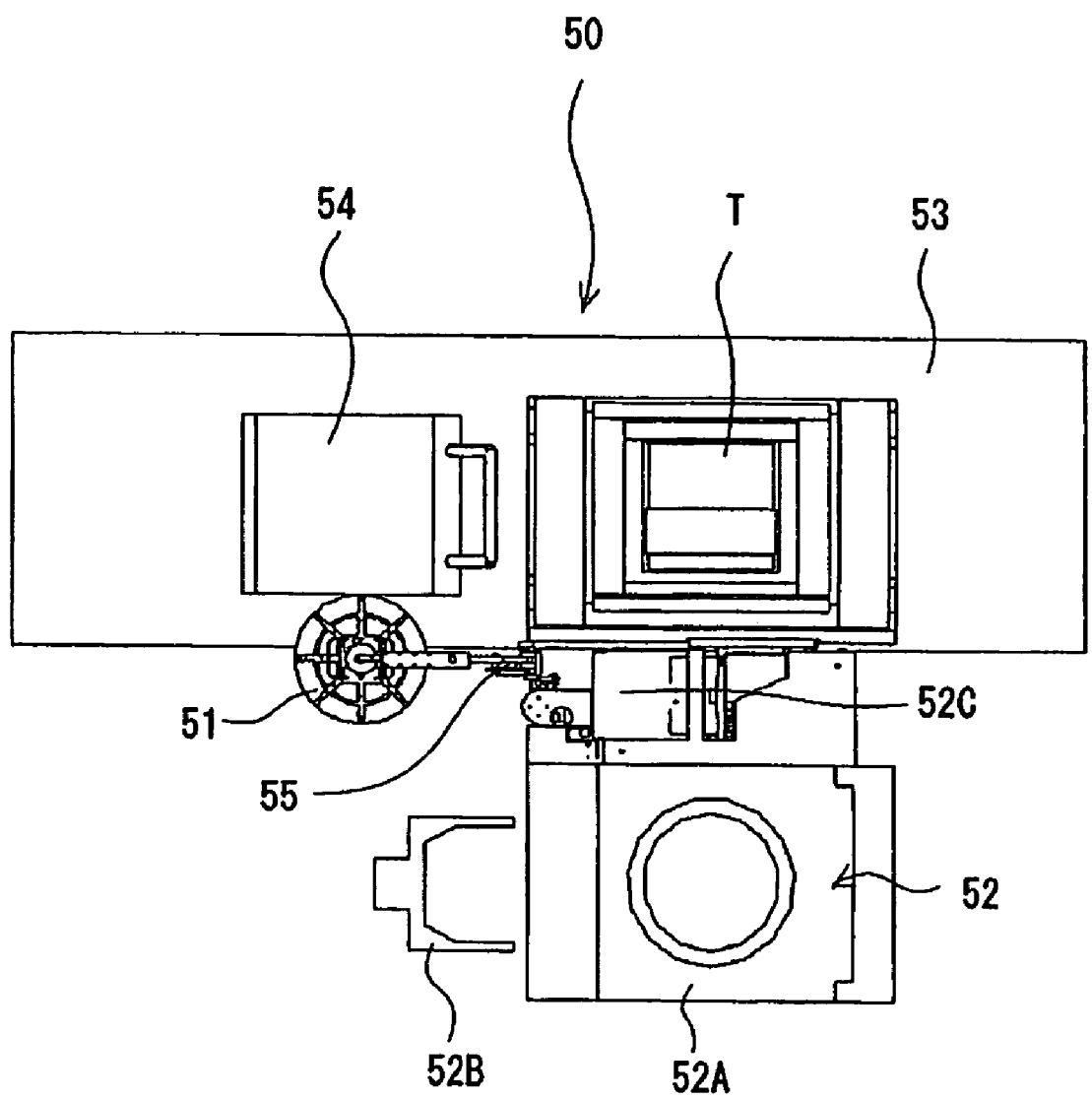
FIG. 1 is a top view showing a preferred embodiment of an inspection equipment in accordance with the present invention.

As shown in FIG. 1, an inspection equipment 50 of the present invention, for example, includes an inspection apparatus 52 employing a probe card 51 for performing an electrical characteristics inspection of an object-to-be-inspected (e.g., a wafer) (not shown); a transfer vehicle 54 for transferring the probe card 51 along a passageway 53 where a plurality of inspection apparatuses 52 is placed; and a probe card transfer assist apparatus 55, which is adapted to assist an operation of transferring the probe card 51 between the transfer vehicle 54 and a card transfer unit 52B disposed at an apparatus main body 52A of the illustrated inspection apparatus 52, the apparatus main body 52A of each inspection apparatus 52 being provided with one card transfer unit 52B. The inspection apparatus 52 is shown in FIG. 1 illustrating a state of where a test head T is rotated to a side of the passageway 53 by a rotational driving mechanism 52C. A plurality of probe cards 51 is accommodated in a maintenance shelf (not shown). Further, for exchanging the probe cards 51 for example, the probe cards 51 are transferred by the transfer vehicle 54 between the maintenance shelf and a plurality of the inspection apparatuses 52. It is noted that only one of the inspection apparatuses 52 is illustrated in FIG. 1.

However, as the aforementioned probe cards 51 have been scaled-up and increased in weight resulting from a recent trend of increasing wafer diameter or highly integrated IC chips or the like, much effort and burden is now placed on not only to an operator hand-carrying such probe cards 51, but also to an operator performing an operation of transferring the probe card 51 between the transfer vehicle 54 and the card transfer unit 52B of the inspection apparatus 52. However, in this preferred embodiment of the present invention, the burden of an operator is reduced in the manners as follows: when the operator transfers the probe cards 51, the transfer vehicle 54 is employed. Further, the probe card transfer assist apparatus 55 is employed for performing an operation of transferring the probe card 51 between the transfer vehicle 54 and the card transfer unit 52B of the inspection apparatus 52.

It is also noted that in case of using the probe card transfer assist apparatus 55, physical labor can be greatly reduced in reality to only placing and removing the probe card 51 at the card transfer unit 52B or the transfer vehicle 54 to a holder of the probe card transfer assist apparatus 55. Further, in case of transferring the probe card 51 by manipulating the probe card transfer assist apparatus 55, the probe card 51 is transferred between the transfer vehicle 54 and the card transfer unit 52B of the inspection apparatus 52 as desired by the operator, in the manner shown in FIGS. 2A and 2B, for example. In addition, the transfer vehicle 54 includes a plurality of vertically arranged levels of extractable shelves prepared to receive a plurality of probe cards 51, and the shelves is configured to accommodate trays having thereon the probe cards 51.

Figure 3A:
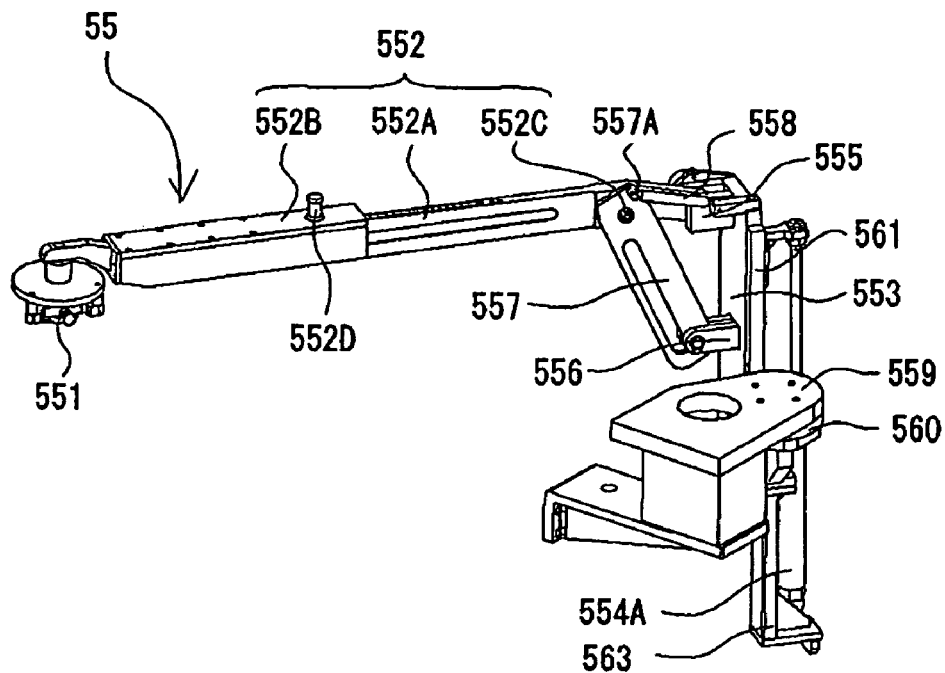
FIG. 3A is a full perspective view and FIG. 3B is a partial perspective view showing an end portion of an arm, each illustrating the probe card transfer assist apparatus employed in the inspection equipment shown in FIG. 1.

The probe card transfer assist apparatus 55 is disposed at one side of the inspection apparatus 52 and includes, as shown in FIG. 3A, a holder 551 for holding the probe card 51; an extensible and contractible arm 552, the holder 551 being disposed at an end portion of the arm 552; a rotatable supporting unit 553 capable of supporting the arm 552; and an air cylinder 554A constituting an elevation driving unit 554 (FIG. 6) which moves the probe card 51 up and down with the supporting unit 553 according to a specified weight of each probe card 51.

Figure 4A:
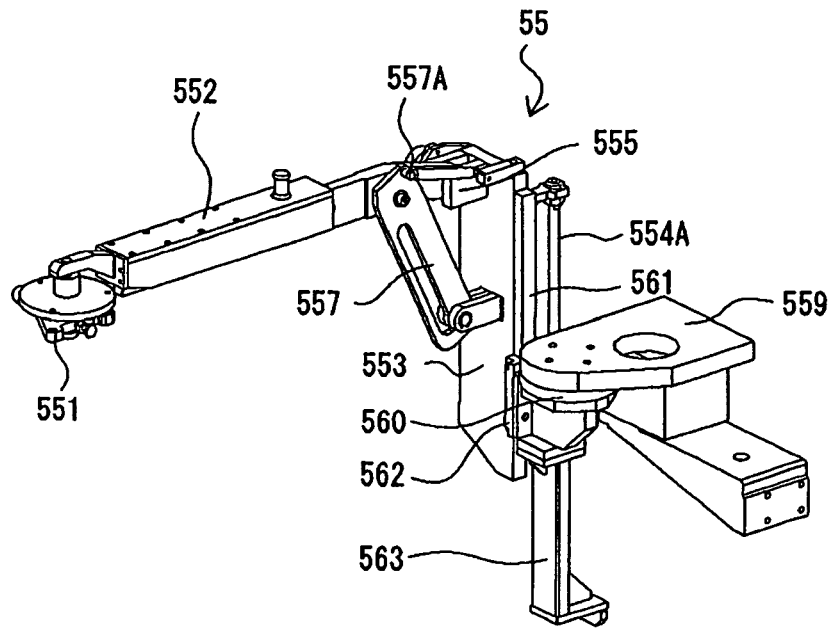
FIG. 4A is a full perspective view showing a contracted state of the arm and FIG. 4B is a full perspective view showing a folded state of the arm, each illustrating the probe card transfer assist apparatus shown in FIGS. 3A and 3B.

The arm 552 includes, as shown in FIGS. 3A and 4A, a first arm 552A and a second arm 552B which is capable of sliding freely on the first arm 552A, so that the second arm 552B can be extended and contracted by being moved forward and backward in relation to the first arm 552A. A length of the arm 552 can be preferably adjusted by fixing the second arm 552B to the first arm 552A with an adjustment member 552D, which prevents a sliding motion of the second arm 552B against the first arm 552A. The arm 552, as shown in FIGS. 3A and 4A, is configured such that a base end portion of the first arm 552A is pin-hinged to a joint 555 fixed to a top end portion of the supporting unit 553.

Figure 4B:
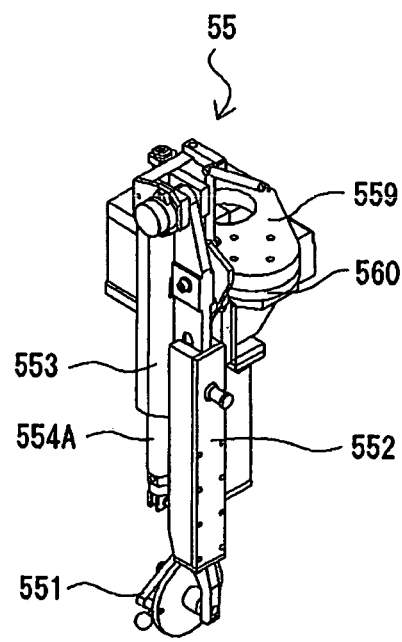

Further, as shown in FIG. 4B, the arm 552 is configured so as to be folded toward the supporting unit 553 at a fully contracted state. A first pin 552C is disposed at a base end portion of the arm 552, and a bracket 556 with a pin attached thereto is disposed approximately at a vertical middle portion of the supporting unit 553. Two end-portions of a link 557 are further connected at the first pin 552C and the pin of the bracket 556, respectively. As a result, the arm 552 can be raised and maintained in a horizontal state by using the link 557. At an end portion of the link 557 at the side of the arm 552, a second pin 557A is attached; and at a side surface of the joint 555 at a side of the supporting unit 553, an engaging member 558 is provided, wherein the engaging member 558 is engaged onto the second pin 557A so as to prevent looseness of the link 557 from the pin of the bracket 556.

The supporting unit 553 and the air cylinder 554A are, as shown in FIG. 3A, all connected to a rotational body 560 disposed at an end portion of a base 559 in a manner capable of rotating freely. Further, it is configured so as to be rotated around an end portion of the base 559 together with the rotational body 560 as a whole. At a vertical end surface of the supporting unit 553 facing the base 559, a guide member 561 is disposed approximately along the whole length. Further, the guide member 561 is slidably disposed along a guide rail 562 (see FIG. 4A) attached in a vertical direction to the rotational body 560 placed at a side of the base 559. Also, the air cylinder 554A is connected to a base portion of a support 563 downwardly extended in a vertical direction from the rotational body 560. A top end of a cylinder rod is also connected to a top end portion of the supporting unit 553. Accordingly, the supporting unit 553 moves up and down along the guide rail 562 by driving the air cylinder 554A.

Figure 3B:
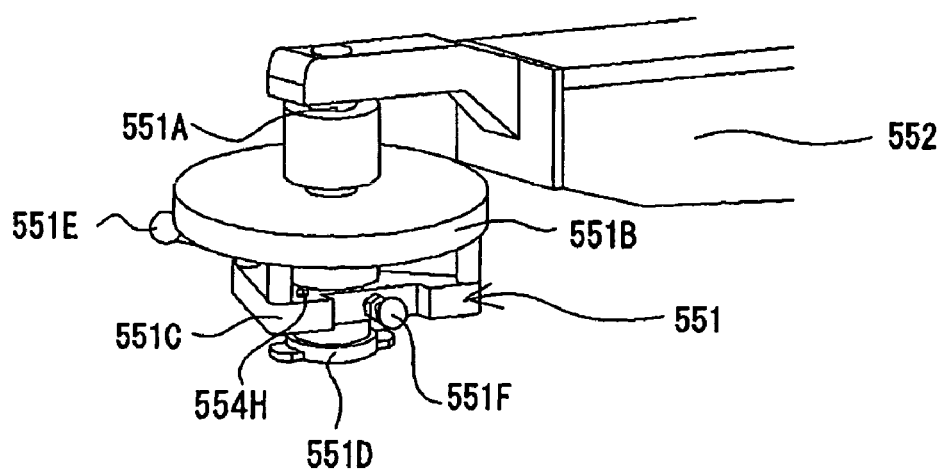

Further, the support 551, as shown in FIG. 3B, includes a rotation shaft 551A disposed so as to vertically extend from a leading end portion of the second arm 552B; a circular member 551B and a triangular member 551C, disposed approximately at a middle and a lower portion thereof of the rotation shaft 551A, respectively; a coupling member 551D connecting with the probe card 51, which is disposed at a bottom end portion of the rotation shaft 551A; a maneuvering handle 551E extended from the rotation shaft 551A in a diametrical direction; and a lock member 551F for locking the maneuvering handle 551E. The holder 551 holds the probe card 51 by rotating the coupling member 551D with the maneuvering handle 551E, and the handle 551E is locked at a holding position with the lock member 551F. The maneuvering handle 551E can also be used to rotate the arm 552 in a locked condition. The coupling member 551D has a protruded portion extended in a horizontal direction from a location rotated 180 degrees relative to each other and in a circumferential direction from a circumference surface of a circular plate, wherein the protruded portions serve to hold the probe card 51 by being inserted into a recess formed on sides of the probe card 51.

Also, provided within the angle member 551C is, for example, a card detecting sensor 554G (FIG. 6) optically detecting the probe card 51. Further, as illustrated in FIG. 3B, on a top surface of the angle member 551C, there is provided the holding position detecting sensor 554H detects the position of the handle 551E, for example, with an electrostatic capacity measured when the maneuvering handle 551E is moved to a side where the probe card is held. A maneuvering switch 554I (FIG. 6) is disposed at the maneuvering handle 551E. Further, when the handle 551E is gripped, the switch 554I turns on, whereas when the handle 551E is let go, the switch 554I turns off. All of the card detecting sensor 554G, the holding position detecting sensor 554H and the maneuvering switch 554I constitutes the elevation driving unit 554 as described hereinafter.

Figure 5A:
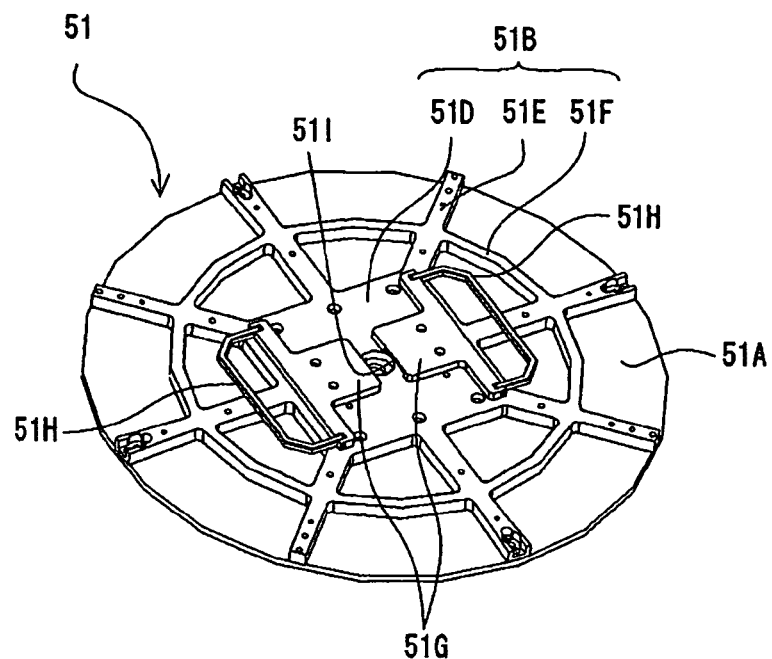
FIG. 5A and FIG. 5B are full perspective views, viewed from the above and the bottom, respectively, showing a probe card transferred by the probe card transfer assist apparatus shown in FIGS. 3A and 3B.
Figure 5B:
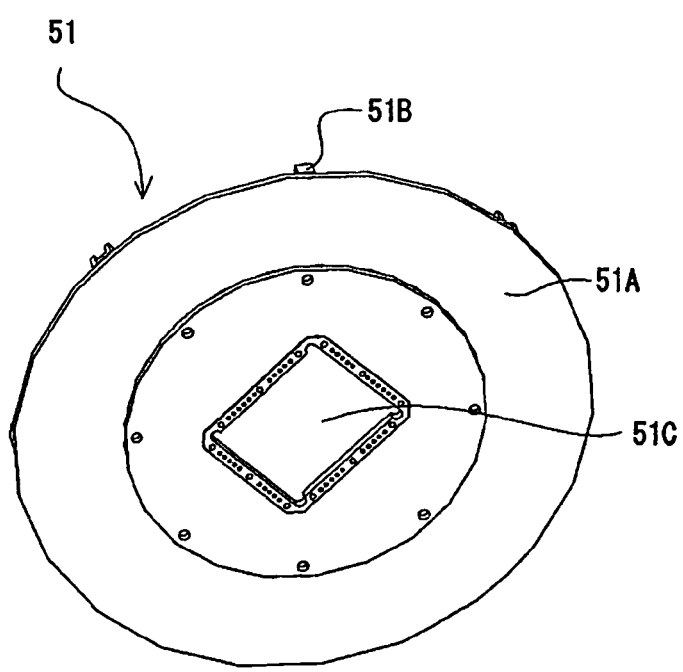

The probe card 51 utilized at the probe card transfer assist apparatus 55 is configured, for example, in a manner shown in FIGS. 5A and 5B. That is, as shown in FIGS. 5A and 5B, the probe card 51, for example, includes: a card main body 51A having a circuit board; a reinforcing member 51B disposed at a top surface of the card main body 51A; and a contactor 51C, having a plurality of pins, disposed at a middle portion of the bottom surface of the card main body 51A. Further, the reinforcing member 51B includes a rectangular section 51D formed at a middle portion of the card main body 51A; a radial section 51E extending radially from the rectangular section 51D to an outside border of the card main body 51A; and a ring-shaped portion 51F formed in a diametrical direction approximately at a middle portion of the radial section 51E. At right and left of a top surface of the rectangular section 51D, a pair of grips 51H are attached to through attaching members 51G, respectively.

At opposite surfaces of the right and left sides of the attaching members 51G, there is formed a recess 51I into which a protruded portion formed at the coupling member 551D of the holder 551 is inserted. Accordingly, by aligning the coupling member 551D such that a pair of the protruded portions are placed between the right and left of the attaching member 51G and then by manipulating the maneuvering handle 551E of the support 551, a pair of the protruded portions are inserted into the right and left of the recess 51I, thereby holding the probe card 51 with the support 551.

Figure 6:
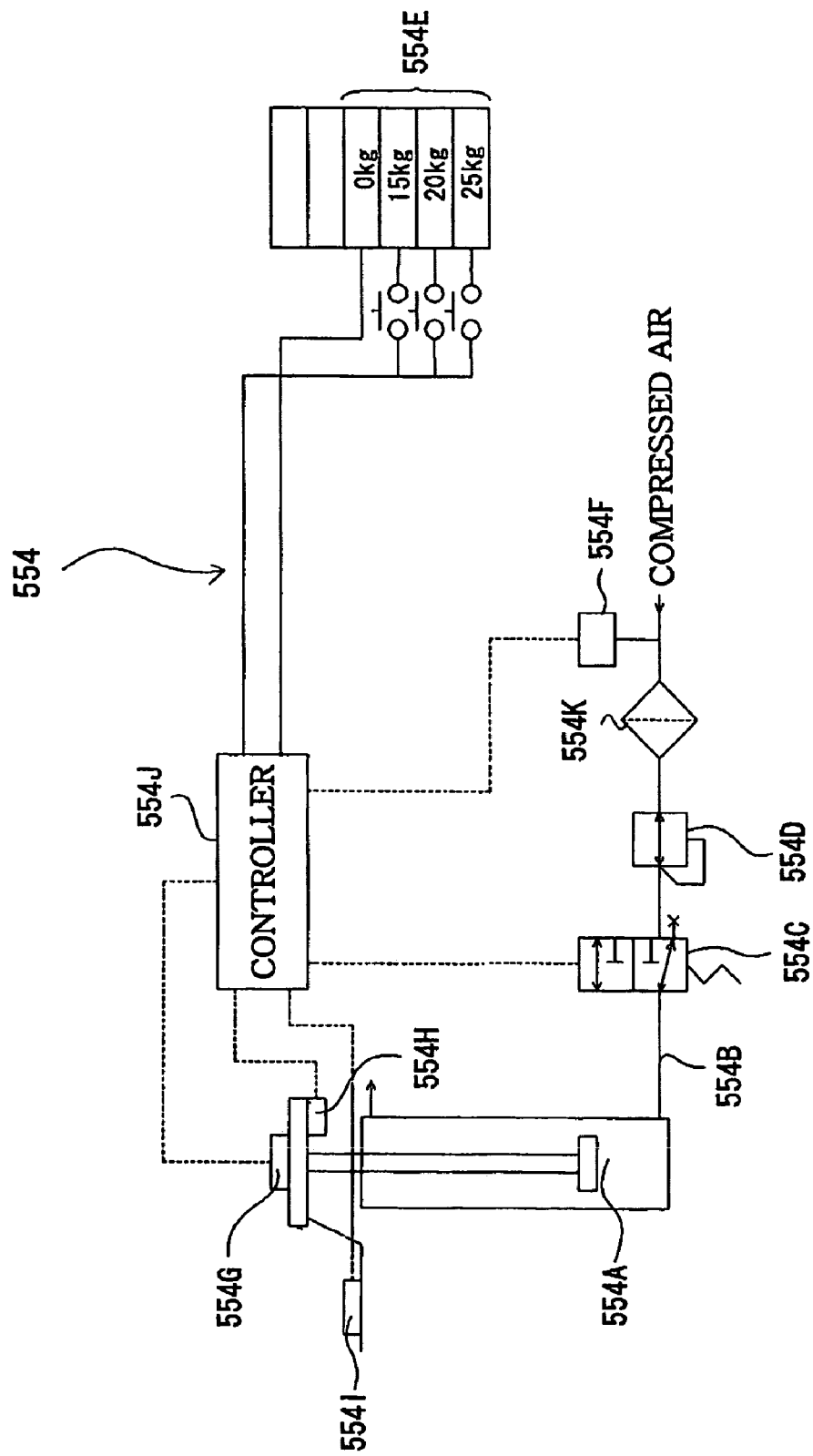
FIG. 6 is a block diagram illustrating a configuration of an elevation driving unit in the probe card transfer assist apparatus shown in FIGS. 3A and 3B.
Figure 7:
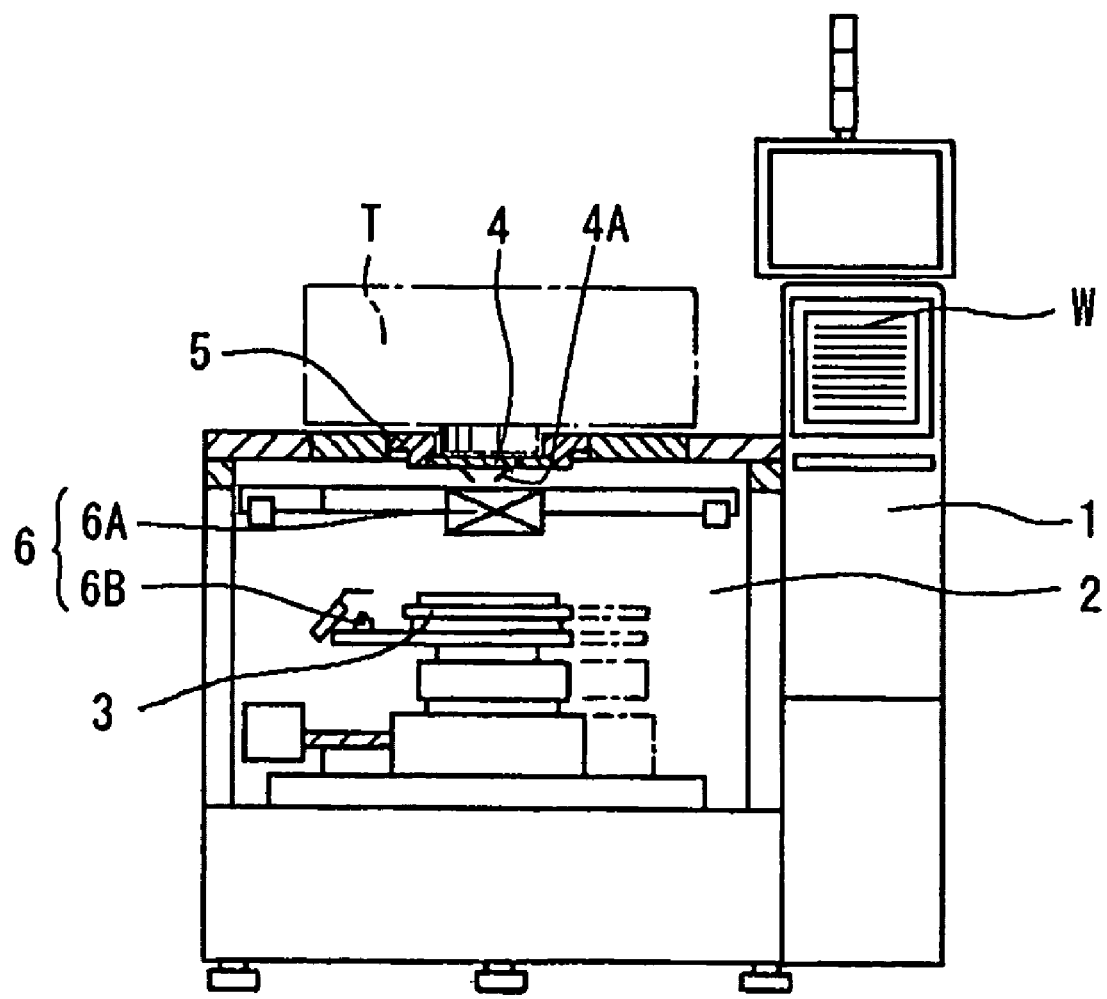
FIG. 7 is a partially cutaway front view showing an example of a conventional inspection apparatus.
Figure 8:
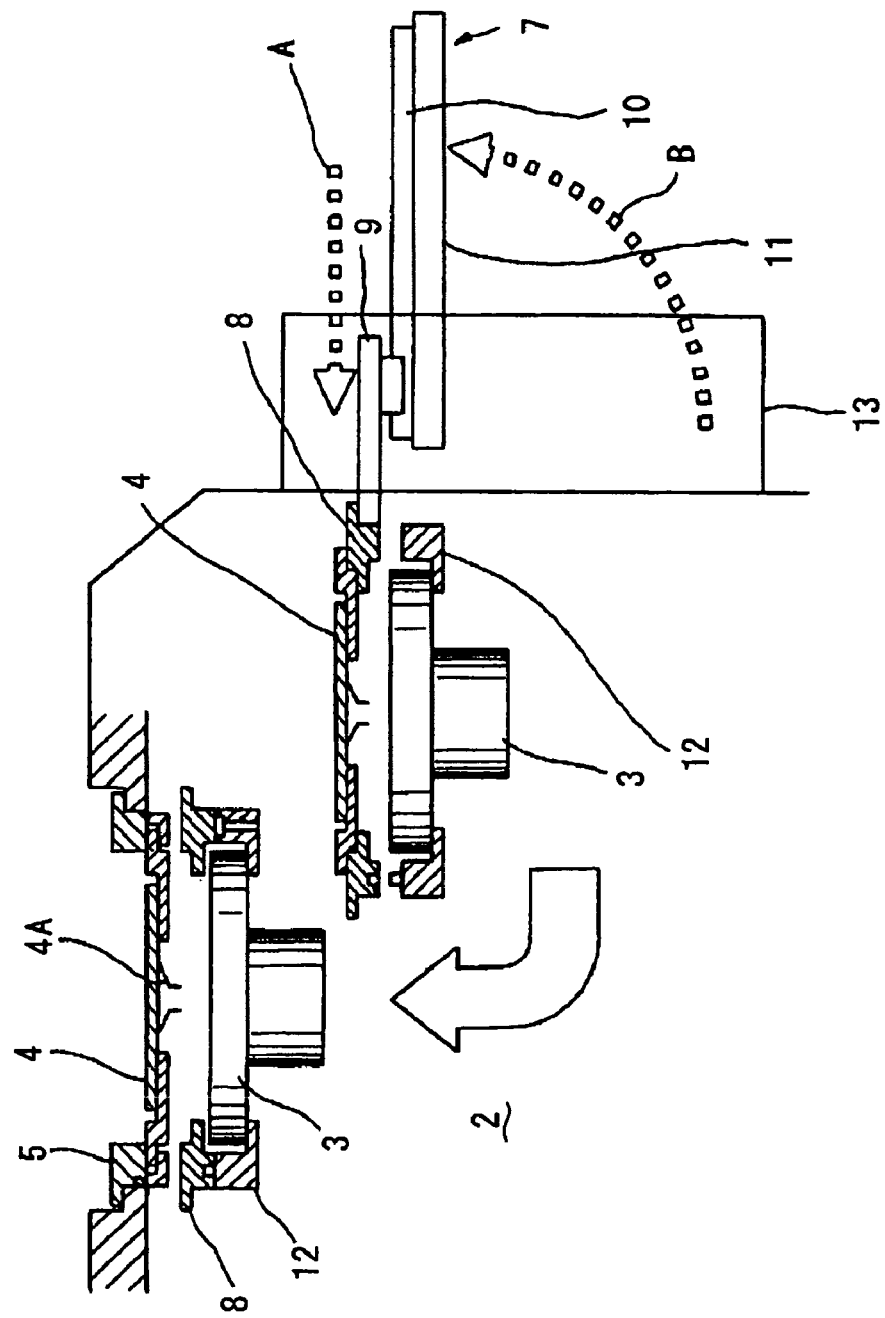
FIG. 8 is an explanatory view showing an operation of the probe card transfer unit employed in the conventional inspection apparatus, shown in FIG. 7.

As shown in FIG. 6, the elevation driving unit 554 for example, includes the air cylinder 554A; an electromagnetic valve (e.g., a three-port valve) 554C for opening and closing a line 554B which provides a driving fluid (compressed air) to the air cylinder 554A; an electro-pneumatic regulator 554D which controls a pressure of the compressed air according to a weight of each probe card 51; an input terminal 554E for inputting a proper pressure value of the compressed air, selected in advance appropriately in line with a weight of each probe card 51, to the electro-pneumatic regulator 554D; and a pressure sensor 554F for detecting pressure of the compressed air. Further, according to an input value from the input terminal 554E, the air cylinder 554A is controlled by having the electromagnetic valve 554C and the electro-pneumatic regulator 554D cooperating together.

Also, the elevation driving unit 554 includes a card detecting sensor 554G which detects presence of the probe card 51; the holding position detecting sensor 554H for detecting whether the maneuvering handle 551E is moved to a holding position where the probe card 51 is supported; and the maneuvering switch 554I which activates when the maneuvering handle 551E is gripped. As explained below, the electromagnetic valve 554C and the electro-pneumatic regulator 554D are controlled open and closed by having all of the card detecting sensor 554G, the holding position detecting sensor 554H, the pressure sensor 554F and the maneuvering switch 554I cooperating together.

That is, each of the card detecting sensor 554G, the holding position detecting sensor 554H, the pressure sensor 554F and the maneuvering switch 554I is electrically connected through a controller 554J to the input terminal 554E, and only when all of the card detecting sensor 554G, the holding position detecting sensor 554H, the pressure sensor 554F and the maneuvering switch 554I are turned on, the electro-pneumatic regulator 554D is actuated under control of the controller 554J based on the input values of the input terminal 554E. At the same time, the electromagnetic valve 554C goes to an "open" state.

Also, when all of the card detecting sensor 554G, the holding position detecting sensor 554H, the pressure sensor 554F and the maneuvering switch 554I are "on", the controller 554J controls the electromagnetic valve 554C open, and compressed air is supplied to the air cylinder 554A via the electro-pneumatic regulator 554D. However, if any one of the card detecting sensor 554G, the holding position detecting sensor 554H, the pressure sensor 554F and the maneuvering switch 554I is in an "off" state, the controller 554J will control the electromagnetic valve 554C close and the compressed air gets sealed within the air cylinder 554A. Further, the operation of the air cylinder 554A is stopped, and the arm 552 is stopped in the course of descending. For example, there could be a case where a weight of the probe card 51 is larger than an inputted weight of the input terminal 554E. Given this circumstance, during a rotation of the arm 552 while gripping the maneuvering handle 551E, a lack of an upthrust force is supplied, thereby gravitationally descending the arm 552.

At this time, if an operator, who was unaware of the error in the input value until then, decides to release the maneuvering handle 551E intentionally or unintentionally, the maneuvering switch 554I will go to an "off" state, thereby closing the electromagnetic valve 554C, and the compressed air supplied to the air cylinder 554A up to that time gets sealed within the air cylinder 554A. Consequently, because the arm 552 gets lowered due to its self-gravity weight of the probe card 51 and because of the compressed air sealed thereof, the arm 552 is stopped, thereby preventing further descending of the probe card 51. Also, in case a weight of the probe card 51 is set too small at the input terminal 554E, a sudden elevation of the air cylinder 554A can be prevented in a manner similar to the above-mentioned case, by releasing the maneuvering handle 551E from hands of an operator. In addition, the reference numeral 554K in FIG. 6 is a mist separator.

Figure 2A:
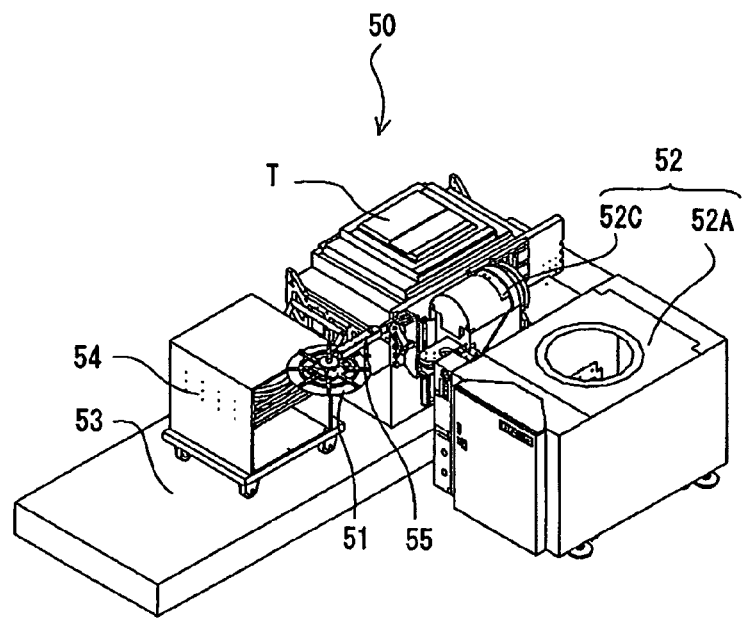
FIGS. 2A and 2B are perspective views, each illustrating a state of transferring a probe card by using a probe card transfer assist apparatus in the inspection equipment shown in FIG. 1.
Figure 2B:
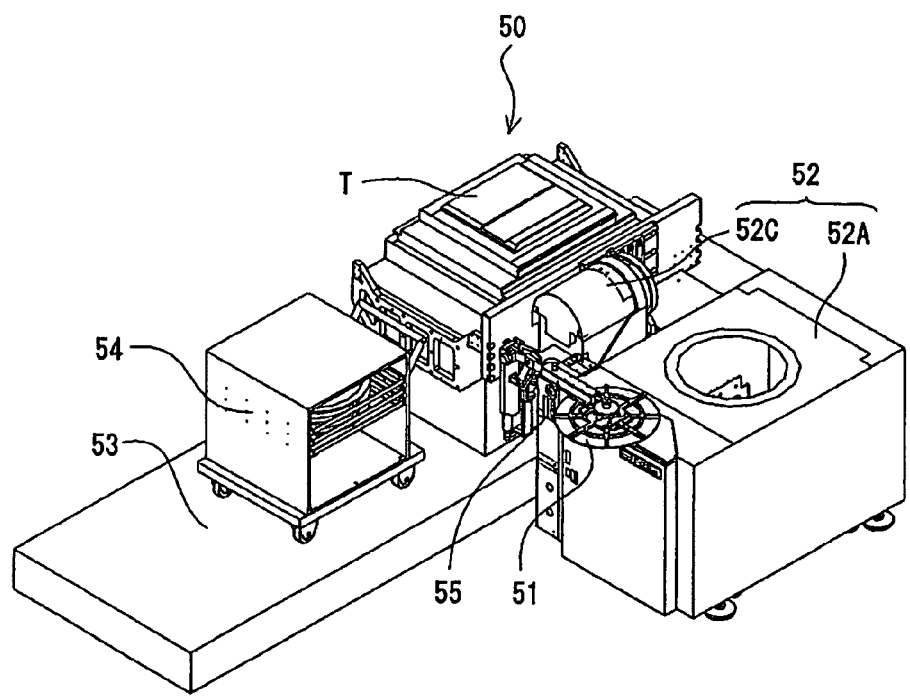

Operation procedures will be described hereinafter. When placing or replacing the probe cards 51 at the inspection apparatuses 52 of the inspection equipment 50, an operator takes out a specific number of the probe cards 51 from the maintenance shelf and loads the probe cards 51 to the transfer vehicle 54 along with the trays. Further, as shown in FIGS. 1, 2A and 2B, the probe cards 51 are transferred to a designated inspection apparatus 52 via the transfer vehicle 54.

While maintaining the probe cards 51 received along with the trays on the shelves of the transfer vehicle 54, the operator first removes a probe card 51 from the transfer vehicle 54 and then moves it to a top surface of the transfer vehicle 54. Only the probe card 51 is then transferred to the inspection apparatus 52 by employing the probe card transfer assist apparatus 55. Here, in case of using the probe card transfer assist apparatus 55, a weight of the probe card 51 is determined and inputted in advance using the input terminal 554E of the elevation driving unit 554. Next, the arm 552 is raised and then by use of the link 557, the arm 552 is maintained at a horizontal state. At this state, the arm 552 is rotated directly above the probe card 51 by manipulating the maneuvering handle 551E. Further, the holder 551 is set to be in alignment with the center of the probe card 51.

Thereafter, the coupling member 551D of the holder 551 is lowered onto the center of the probe card 51 by pressing the maneuvering handle 551E towards the probe card 51. Next, the protruded portions of the coupling member 551D are inserted into the recess 51I formed at the attaching member 51G of the probe card 51 by rotating the maneuvering handle 551E. The maneuvering handle 551E is then fixed by manipulating the lock member 551F. At this time, the card detecting sensor 554G is configured to detect the probe card 51 while a status of whether the maneuvering handle 551E is at a probe card support-position is determined by means of employing the holding position detecting sensor 554H. If the operator is gripping the maneuvering handle 551E at this time, the maneuvering switch 554I goes to an "on" state. Because the pressure sensor 554F is at an "on" state after detecting an ordinary pressure of the compressed air, the electromagnetic valve 554C turns to an "open" state.

Moreover, a desired amount of compressed air based on the inputted weight of the probe card 51 is supplied into the air cylinder 554A under control of the electro-pneumatic regulator 554D. Resulting from this, an assisting force is provided in a direction of which the probe card 51 is lifted from the shelf of the transfer vehicle 54 by the arm 552. Now, the operator lifts the probe card 51 by manipulating the maneuvering handle 551E from the shelf of the transfer vehicle 54.

Further, by rotating the arm 552 toward the inspection apparatus 52, the probe card 51 is moved directly over to the card transfer unit 52B of the inspection apparatus 52.

The probe card 51 is then lowered and placed onto the card transfer unit 52B from directly above the card transfer unit 52B by pressing the maneuvering handle 551E in a sliding manner. Next, the lock member 551F of the holder 551 is released, thereby allowing rotation the maneuvering handle 551E. From there, the protruded portion of the coupling member 551D is disengaged from the recess 51I, and then the probe card 51 is released from the support 551, thereby completing the operation of transferring a probe card 51.

However, there could be a case where a weight of a probe card 51 is wrongly inputted, for example, less than an actual weight in the input terminal 554E. At the same time, the maneuvering handle 551E could be gripped, thereby turning the maneuvering switch 551I on, which in turn operates the air cylinder 554A driven by the electro-pneumatic regulator 554D. In this case, because the arm 552 is descended due to the heavier weight of the probe card 51 during rotation of the arm 552, the maneuvering handle 551E could be released from hands of the operator as a result. Here, because the maneuvering switch 551I goes automatically to an "off" state, the electromagnetic valve 554C is shut, thereby sealing the compressed air supplied up to that time within the air cylinder 554A. Accordingly, the descending arm 552 is stopped during the way before falling completely due to the pressure of the compressed air sealed within the air cylinder 554A. This prevents collisions of the probe card 51 against the transfer vehicle 54 or the like and also prevents the probe card 51 from damage.

Further, when transferring the probe cards 51 from the inspection apparatuses 52 to the transfer vehicle 54, the probe card transfer assist apparatuses 55 can be employed in the order described hereinbefore. Consequently, the transfer of the probe cards 51 can be carried out with ease.

In accordance with the aforementioned embodiments of the present invention, the inspection equipment 50 includes the inspection apparatus 52 (only one is illustrated in FIG. 1) employing the probe card 51 for performing an electrical characteristics inspection of a wafer; the: transfer vehicle 54 for transferring the probe card 51 along the passageway 53 where a plurality of the inspection apparatuses 52 is placed; and the probe card transfer assist apparatus 55 which is adapted to assist an operation of transferring of the probe card 51 between the transfer vehicle 54 and the card transfer unit 52B disposed at the apparatus main body 52A of the illustrated inspection apparatus 52, the apparatus main body 52A of each inspection apparatus 52 being provided with one card transfer unit 52B.

Further, the probe card transfer assist apparatus 55 includes the holder 551 for holding the probe card 51; the extensible and contractible arm 552 disposed at an end portion of the support 551; the supporting unit 553 capable of freely rotating while supporting the arm 552; and the elevation driving unit 554 which moves the probe card 51 up and down with the above supporting unit 553 according to the weight of the probe card 51. Accordingly, by supporting the probe card 51 with the support 551, lifting the arm 552 with the elevation driving unit 554 from the transfer vehicle 54 or from the card transfer unit 52B of the inspection apparatus 52, and rotating the arm 552, the probe card 51 could be transferred between the transfer vehicle 54 and the card transfer unit 52B of the inspection apparatus 52 with ease, thereby reducing burden of operator significantly.

Also, because the arm 552 moves the probe card 51 held by the holder 551 by rotating, a range of the arm's motion which sets a base end of the arm 552 as a center could be allowed, minimally restricting the range of motion. Accordingly, a plurality of the inspection apparatuses 52 can be aggregate to save space for the inspection equipment 50, and to thereby make gaps between each adjacent inspection apparatus 52 small. Consequently, although it may be impossible to dispose the transfer vehicle 54 between the small gaps, spaces for the arms 552 to rotate from the transfer vehicle 54 disposed along the passageway 53 to a side of the inspection apparatus 52 can be obtained. At the same time, spaces sufficient enough for the operator to enter and exit can also be maintained.

In accordance with the above embodiments of the present invention, the holder 551 includes the coupling member 551D capable of connecting with the probe card 51 by means of rotational manipulation. Therefore, only by rotating the coupling member 551D with the maneuvering handle 551E of the support 551, the probe card 51 can be easily held by the support 551.

Further, because the arm 552 is configured to be horizontally projected from the top of the supporting unit 553 and capable of folding toward the supporting unit 553, the arm 552 can be compactly stored at a side of the inspection apparatus 52. Therefore, its occupying space in a clean room can be minimized.

Further, the elevation driving unit 554 includes the air cylinder 554A which moves the arm 552 up and down; the electromagnetic valve 554C for opening and closing a line 554B which provides compressed air to the air cylinder 554A; the electro-pneumatic regulator 554D which controls a pressure of the compressed air according to a weight of a probe card 51; the input terminal 554E for inputting a pressure value of the compressed air to the electro-pneumatic regulator 554D in advance; and the pressure sensor 554F for detecting pressure of the compressed air. Therefore, a driving force of the air cylinder 554A can be controlled according to a weight of the probe card 51. It is also preferred that a weight of the probe card 51 is measured with a weight sensor and the driving force of the air cylinder 554A is controlled based on the measured weight.

Further, the elevation driving unit 554 includes the card detecting sensor 554G for detecting presence of a probe card 51. The card detecting sensor 554G and the input terminal 554E cooperate to actuate the electro-pneumatic regulator 554D, thereby allowing the air cylinder 554A to be driven based on the weight of the probe card 51. Also, the elevation driving unit 554 includes the maneuvering switch 554I which is used in manipulating the arm 552, and the maneuvering switch 554I and the pressure sensor 554F cooperate to open and close the electromagnetic valve 554C. Therefore, if the maneuvering handle 554E is let go from hands of the operator, the electromagnetic valve 554C will be closed, thus restricting a gravitational descending of the arm 552 due to weight of the probe card 51. This aids in prevention of the probe card 51 from damage.

Further, the present invention is not limited to the aforementioned embodiments, and each element may be modified as desired.

The present invention can be suitably used in an inspection equipment where a plurality of inspection apparatuses employing probe cards are provided.

While the invention has been shown and described with respect to the preferred embodiments, it will be understood by those skilled in the art that various changes and modification may be made without departing from the scope of the invention as defined in the following claims.

What is claimed is:

1. A probe card transfer assist apparatus for assisting an operation of transferring a probe card used in an electrical inspection apparatus, the apparatus comprising:
a holder for holding the probe card;
a support for supporting the holder in a freely-rotatable manner about a point; and
an elevation unit for moving the support up and down,
wherein the holder includes a coupling member configured to connect the holder with a center of the probe card via rotation of the coupling member;
a maneuvering handle for manipulating the coupling member; and a holding position detecting sensor for detecting a position of the maneuvering handle to determine whether the maneuvering handle is at a probe card support-position.

2. The apparatus according to claim 1, wherein the holder is attached at an arm protruded from the support, the arm capable of extending and contracting.

3. The apparatus according to claim 2,
wherein the elevation unit includes:
a cylinder mechanism for moving the arm up and down;
a valve for opening and closing a line through which a driving fluid is supplied to the cylinder mechanism;
a regulator for controlling pressure of the driving fluid; an input terminal for inputting a weight of the probe card to the regulator in advance, the regulator being controlled based on the weight of the probe card; and
a pressure sensor for detecting the pressure of the driving fluid.

4. The apparatus according to claim 1, wherein the elevation unit is configured to provide an assisting force in a direction of which the probe card is pushed upwards.

5. The apparatus according to claim 4,
wherein the assisting force is varied according to the weight of the probe card.

6. The apparatus according to claim 1, wherein the apparatus is disposed at the inspection apparatus.

7. The apparatus according to claim 1, wherein the apparatus is provided between the inspection apparatus and a transfer means for transferring the probe card, when assisting the transferring of the probe card between the inspection apparatus and the transfer means.

8. The apparatus according to claim 7,
wherein the transfer means is a transfer vehicle.

9. The apparatus according to claim 1, wherein the elevation unit includes a card detect sensor for detecting presence of the probe card.

10. An inspection equipment, comprising:
an electrical inspection apparatus; and
a probe card transfer assist apparatus for assisting an operation of transferring a probe card used in the electrical inspection apparatus, the assist apparatus including:
a holder for holding the probe card;
a support for supporting the holder in a freely-rotatable manner about a point; and an elevation unit for moving the support up and down,
wherein the holder includes a coupling member configured to connect the holder with a center of the probe card via rotation of the coupling member;
a maneuvering handle for manipulating the coupling member; and a holding position detecting sensor for detecting a position of the maneuvering handle to determine whether the maneuvering handle is at a probe card support-position.

11. The equipment according to claim 10, wherein the holder is attached at an arm protruding from the support, the arm capable of extending and contracting.

12. The equipment according to claim 11,
wherein the elevation unit includes:
a cylinder mechanism for the elevation of the arm;
a valve for opening and closing a line through which a driving fluid is supplied to the cylinder mechanism;
a regulator for controlling pressure of the driving fluid; an input terminal for inputting a weight of the probe card to the regulator in advance, the regulator being controlled based on the weight of the probe card; and
a pressure sensor for detecting the pressure of the driving fluid.

13. The equipment according to claim 10, wherein the elevation unit is configured to provide an assisting force in the direction of which the probe card is pushed upwards.

14. The equipment according to claim 13,
wherein the assisting force is varied according to a weight of the probe card.

15. The equipment according to claim 10, wherein the probe card transfer assist apparatus is disposed at the inspection apparatus.

16. The equipment according to claim 10, wherein the probe card transfer assist apparatus is presented between the inspection apparatus and a transfer means, when the operation of transferring the probe card is assisted between the inspection apparatus and the transfer means for transferring the probe card used at the inspection apparatus.

17. The equipment according to claim 16,
wherein the transfer means is a transfer vehicle.

18. The equipment according to claim 10, wherein the elevation unit includes a card detect sensor for detecting presence of the probe card.

19. An inspection method, comprising the steps of:
(a) transferring a probe card to an area adjacent to the inspection apparatus;
(b) transferring the probe card to the inspection apparatus; and
(c) performing an electric inspection by contacting the probe card to an object-to-be-inspected,
wherein the step (b) includes:
a process of supporting the probe card;
a process of moving the probe card up and down; and
a process of rotating the probe card about a point, and
a process of determining whether a maneuvering handle for manipulating a coupling member is at a probe card support-position using a holding position detecting sensor for detecting a position of the maneuvering handle,
wherein the method further comprises the step of detecting presence of the probe card by a card detected sensor prior to the process of moving the probe and up and down in the step (b).

20. The method according to claim 19, wherein a plurality of the inspection apparatuses is provided; and
in the step (a), the probe card is transferred by a transfer vehicle capable of moving along a passageway provided along the inspection apparatuses.

21. The method according to any one of claims 19 to 20, wherein the step of moving the probe card up and down includes controlling of a force required to move the probe card up and down based on a weight of the probe card by using a driving fluid supplied to a cylinder mechanism.

22. A probe card transfer assist apparatus for assisting an operation of transferring a probe card used in an electrical inspection apparatus, the apparatus comprising:
   a holder for holding the probe card;
   a support for supporting the holder in a freely-rotatable manner about a point; and
   an elevation unit for moving the support up and down,
   wherein the holder includes a coupling member configured to connect the holder with a center of the probe card via rotation of the coupling member; and a maneuvering handle for manipulating the coupling member, the holder is connected with the probe card such that protruded portions of the coupling member are inserted into a recess formed at the probe card by rotating the maneuvering handle.

23. An inspection equipment, comprising:
   an electrical inspection apparatus; and
   a probe card transfer assist apparatus for assisting an operation of transferring a probe card used in the electrical inspection apparatus, the assist apparatus including:
      a holder for holding the probe card;
      a support for supporting the holder in a freely-rotatable manner about a point; and
      an elevation unit for moving the support up and down,
   wherein the holder includes a coupling member configured to connect the holder with a center of the probe card via rotation of the coupling member; and a maneuvering handle for manipulating the coupling member, the holder is connected with the probe card such that protruded portions of the coupling member are inserted into a recess formed at the probe card by rotating the maneuvering handle.

* * * * *